(12) United States Patent
Jeon et al.

(10) Patent No.: US 8,576,644 B2
(45) Date of Patent: Nov. 5, 2013

(54) MEMORY DEVICES HAVING CONTROLLERS THAT DIVIDE COMMAND SIGNALS INTO TWO SIGNALS AND SYSTEMS INCLUDING SUCH MEMORY DEVICES

(75) Inventors: Seong Hyun Jeon, Hwaseong-si (KR); Hoi Ju Chung, Yongin-si (KR); Jung Sunwoo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 57 days.

(21) Appl. No.: 13/348,672

(22) Filed: Jan. 12, 2012

(65) Prior Publication Data
US 2012/0182815 A1 Jul. 19, 2012

(30) Foreign Application Priority Data

Jan. 19, 2011 (KR) .................. 10-2011-0005351

(51) Int. Cl.
*G11C 7/00* (2006.01)
(52) U.S. Cl.
USPC ......... 365/191; 365/193; 365/194; 365/233.1
(58) Field of Classification Search
USPC .................. 365/191, 193, 194, 233.1
See application file for complete search history.

(56) References Cited

U.S. PATENT DOCUMENTS

| | | | |
|---|---|---|---|
| 6,044,026 A * | 3/2000 | Morgan ................. | 365/194 |
| 6,330,682 B1 * | 12/2001 | Kanazashi et al. ........... | 713/400 |
| 6,356,507 B1 * | 3/2002 | Kaku et al. ................. | 365/233.1 |
| 6,567,339 B2 | 5/2003 | Bando | |
| 6,876,595 B2 * | 4/2005 | Bhavnagarwala et al. ........................ | 365/230.03 |
| 7,042,798 B2 | 5/2006 | Kato et al. | |
| 7,548,485 B2 * | 6/2009 | Kim et al. .................. | 365/233.1 |
| 8,233,339 B2 * | 7/2012 | Yoon et al. .................... | 365/194 |
| 8,395,962 B2 * | 3/2013 | Lee .......................... | 365/230.06 |
| 2009/0059692 A1 | 3/2009 | Park | |

FOREIGN PATENT DOCUMENTS

| | | |
|---|---|---|
| JP | 2002-304885 | 10/2002 |
| JP | 2005-208730 | 8/2005 |
| JP | 2009-064537 | 3/2009 |
| KR | 1020030009080 A | 1/2003 |
| KR | 100884604 B1 | 2/2009 |

* cited by examiner

*Primary Examiner* — Viet Q Nguyen
(74) *Attorney, Agent, or Firm* — Myers Bigel Sibley & Sajovec

(57) ABSTRACT

A memory device using error correcting code and a system including the same are provided. The memory device includes a memory cell array including a plurality of bit lines and a plurality of memory cells; an access block for accessing the memory cell array; and a controller block for receiving a first operation command signal, dividing the first operation command signal into at least two paths pulse signals corresponding to at least two paths, based on a pre-determined criterion, and then supplying the at least two path pulse signals to the access block. The access block operates based on an output signal of the controller block.

23 Claims, 14 Drawing Sheets

US 8,576,644 B2

MEMORY DEVICES HAVING CONTROLLERS THAT DIVIDE COMMAND SIGNALS INTO TWO SIGNALS AND SYSTEMS INCLUDING SUCH MEMORY DEVICES

CROSS-REFERENCE TO RELATED APPLICATION

This application claims priority under 35 U.S.C. §119 to Korean Patent Application No. 10-2011-0005351, filed on Jan. 19, 2011 in the Korean Intellectual Property Office, the disclosure of which is incorporated herein in its entirety by reference.

BACKGROUND

The inventive concept relates to memory devices, and more particularly, to memory devices which reduce or prevent internal and external commands input thereto from overlapping with one another, and to systems that include such memory devices.

Semiconductor memory devices may be classified into volatile memory devices, e.g., dynamic random access memory (DRAM) and static random access memory (SRAM), and non-volatile memory devices, e.g., phase change random access memory (PRAM), resistive random access memory (RRAM), and magnetic random access memory (MRAM).

If read commands are input to a semiconductor memory device at intervals that are shorter than predetermined intervals, then a read operation that is being performed according to a previous read command should be stopped and be newly performed.

Furthermore, in order to operate semiconductor memory devices that employ error correction coding (ECC) techniques, there is a need to develop a technique of operating the semiconductor device according to at least two read commands, e.g., an internal read command and an external read command, or at least two internal read commands, while preventing the at least two commands from being affected by each other.

SUMMARY

According to some embodiments of the present inventive concept, there is provided a memory device including a memory cell array that has a plurality of bit lines and a plurality of memory cells, an access block that is configured to access the memory cell array, and a controller that is configured to receive a first operation command signal, and divide the first operation command signal into at least a first path pulse signal that is transmitted on a first path and a second path pulse signal that is transmitted on a second path based on a predetermined criterion, where the access block operates based on an output signal of the controller. The first and second path pulse signals may be outputted to the access block.

The controller may include a selector that is configured to divide the first operation command signal into the first path pulse signal and the second path pulse signal based on a first selection signal input thereto, a first pulse generator that is disposed along the first path and that is configured to increase a pulse width of the first path pulse signal, a second pulse generator that is disposed along the second path and that is configured to increase a pulse width of the second path pulse signal, a first logic gate that is configured to receive output signals of the first and second pulse generators, and a first pulse generator group that is connected to an output of the first logic gate, the first pulse generator group including a plurality of third pulse generators that are connected in series, where the access block receives the output of the first logic gate, and where each of the plurality of third pulse generators increases a pulse width of a signal input thereto stating from a predetermined point of time, and then outputs a respective signal having the increased pulse width to the access block.

The controller may include a first finite state machine that is configured to supply the first selection signal to the selector and to supply a plurality of first clear signals to the first pulse generator, the second pulse generator and the plurality of third pulse generators, respectively.

The plurality of memory cells included in the memory cell array may include a plurality of data cells for storing data or data bits, and error correcting code (ECC) cells for storing ECC bits.

The controller may also include a second finite state machine that is configured to output a second selection signal in response to an output signal of the first pulse generator group and a second operation command signal, a second logic gate that is configured to receive the first operation command signal and the second selection signal, a fourth pulse generator that is configured to receive an output of the second logic gate and increase a pulse width of the output signal of the second logic gate, a fifth pulse generator that is configured to receive the second operation command signal, a third logic gate that is configured to receive output signals of the fourth pulse generator and the fifth pulse generator, perform a logic operation thereon, and then output a result of the logic operation, and a second pulse generator group connected to the third logic gate, the second pulse generator group including a plurality of sixth pulse generators that are connected in series, where the access block receives the output of the third logic gate, and each of the plurality of sixth pulse generators increases a pulse width of a signal input to each of the plurality of sixth pulse generators, starting from a predetermined point of time, and then outputs a respective signal having the increased pulse width to the access block.

The second finite state machine may output a plurality of second clear signals, and each of the fourth pulse generator, the fifth pulse generator, and the plurality of sixth pulse generators increases a pulse width of the signal input thereto based on one of the plurality of second clear signals.

According to some embodiments of the present inventive concept, there is provided a memory device including a memory cell array including a data cell region for storing data or data bits, and an error correcting code (ECC) cell region for storing ECC bits, an access block that is configured to access the memory cell array, and a controller that is configured to receive at least first and second operation command signals, and divide each of the first and second operation command signals into a first path pulse signal and a second path pulse signal that correspond to respective first and second paths based on a predetermined criterion, where the access block operates based on an output signal of the controller. The first and second path pulse signals may be outputted to the access block.

The controller may include a first finite state machine that is configured to receive the second operation command signal and to output a first selection signal based on the second operation command signal, a first logic gate that is configured to receive the first operation command signal and the first selection signal, perform a logic operation thereon, and then outputting the result of the logic operation, a first pulse generator that is configured to receive an output signal of the first logic gate and increase a pulse width of the output signal of the first logic gate, a second pulse generator that is configured to receive the second operation command signal, a second logic gate that is configured to receive output signals of the first pulse generator and the second pulse generator, perform a logic operation thereon, and then output a result of the logic operation, and a first pulse generator group that is connected to the first logic gate, the first pulse generator group including a plurality of third pulse generators that are connected in series, where the access block receives the output of the second logic gate, and where each of the plurality of third pulse generators increases a pulse width of a signal input to each of the plurality of third pulse generators, starting from a predetermined point of time, and then outputs a respective signal having the increased pulse width to the access block.

The controller may also include a first finite state machine that is configured to receive the first operation command signal and the second operation command signal and to output a first selection signal based on the first operation command signal and the second operation command signal, a first pulse generator that is configured to increase a pulse width of the first operation command signal, a first pulse generator group that is configured to receive an output signal of the first pulse generator, increase a pulse width of the output signal of the first pulse generator starting from a predetermined point of time, and then output a signal having the increased pulse width a first logic gate that is configured to receive the first selection signal and an output signal of the first pulse generator group, perform a logic operation thereon, and then output a result of the logic operation, a second pulse generator that is configured to receive an output signal of the first logic gate, increase a pulse width of the output signal of the first logic gate starting from a predetermined point of time, and then output a signal having the increased pulse width, a third pulse generator that is configured to receive the second operation command signal; a second logic gate that is configured to receive output signals of the second pulse generator and the third pulse generator, perform a logic operation thereon, and then output a result of the logic operation, and a second pulse generator group that is connected to the second logic gate, the second pulse generator group including a plurality of fourth pulse generators that are connected in series, where each of the plurality of fourth pulse generators increases a pulse width of a signal input to each of the plurality of fourth pulse generators starting from a predetermined point of time, and outputs a respective signal having the increased pulse width to the access block.

The first logic gate may be an AND gate and the second logic gate may be an OR gate.

Each of the second pulse generator and the plurality of third pulse generators may increase a pulse width of a signal input thereto based on an output signal of the first logic gate.

According to further embodiments of the inventive concept, memory devices are provided that include a memory cell array that has a plurality of bit lines and a plurality of memory cells. These memory devices further include an access block that is configured to access the memory cells via the plurality of bit lines. A controller is also provided that is configured to selectively route a plurality of pulses that are included in one or more operation command signals to one of a first path or a second path in response to a selection signal. Finally, the memory devices include a combiner that is configured to combine a first signal that is output from the first path and a second signal that is output from the second path and to supply the combined signal to the access block.

A first pulse generator may be disposed on the first path and a second pulse generator may be disposed on the second path.

At least one of the first and second pulse generators may be configured to increase a pulse width of a pulse signal that is input thereto.

The memory device may also include a first group of pulse generators that are connected in series, where a third pulse generator that is on an end of the first group of pulse generators receives the combined signal.

The combiner may be a logic gate that receives the first and second signals.

Each pulse generator in the first group of pulse generators may be configured to increase a pulse width of a respective pulse signal that is input thereto.

The one or more operation command signals may include a first operation command signal and a second operation command signal, The memory device may also include a logic gate that receives the first operation command signal and a selection signal, where the output of the logic gate is connected to the first path.

According to additional embodiments of the inventive concept, methods of providing first and second read commands to an access block of a memory device are provided. Pursuant to these methods, the first read command is transmitted on a first path and the second read command is transmitted on a second path. A pulse width of the first read command is increased to provide a modified first read command. Finally, the modified first read command is provided to the access block.

In some cases, a pulse width of the second read command may be increased to provide a modified second read command, and the modified second read command may also be provided to the access block.

A combined signal may be generated that includes the modified first read command and the modified second read command. This combined signal may be provided to the access block. A pulse width of the modified first read command may be set based on the operation command signal that includes the first and second read commands.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1A:
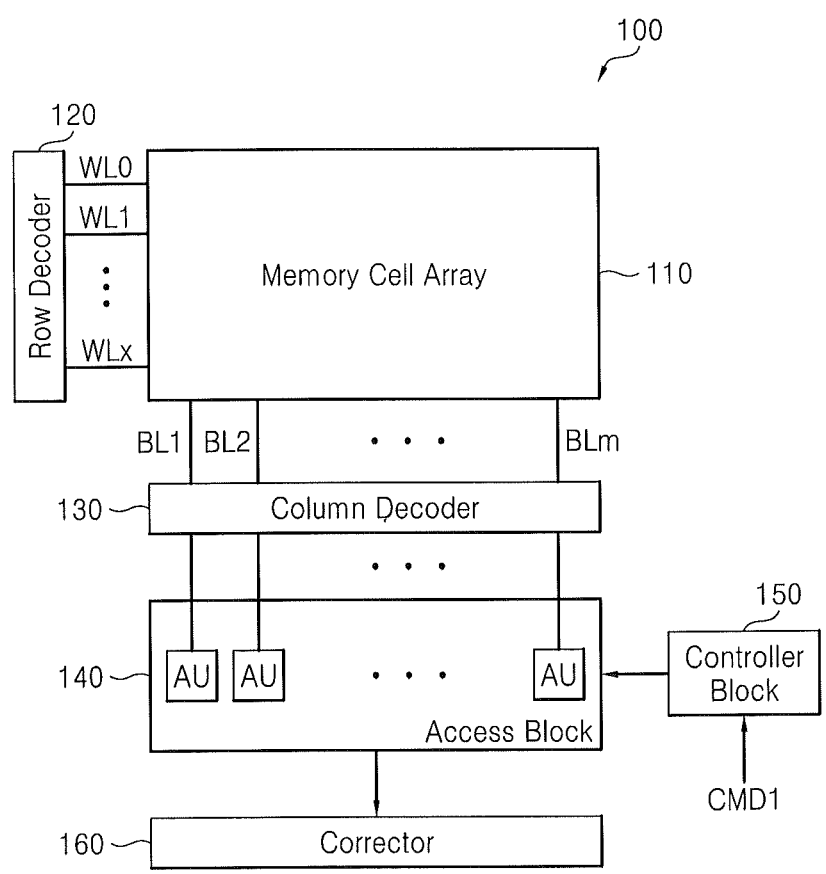
FIG. 1A illustrates a memory device according to an embodiment of the inventive concept.

The inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1B:
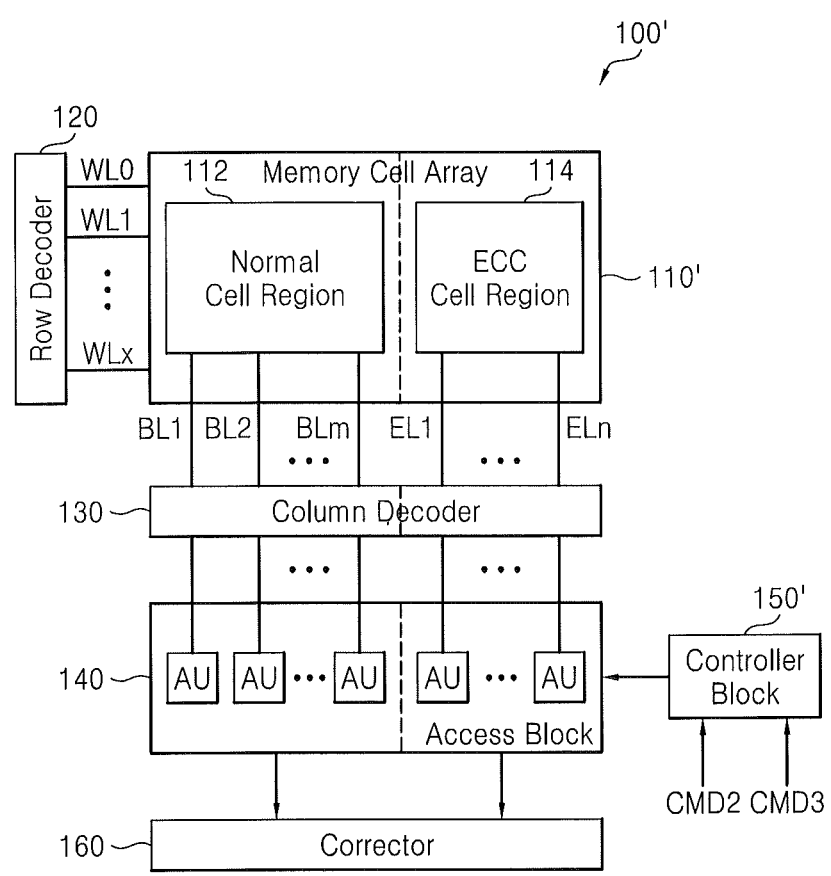
FIG. 1B illustrates a memory device according to another embodiment of the inventive concept.

FIG. 1A illustrates a memory device 100 according to an embodiment of the inventive concept. FIG. 1B illustrates a memory device 100' according to another embodiment of the inventive concept.

Referring to FIG. 1A, the memory device 100 includes a memory cell array 110, a row decoder 120, a column decoder 130, an access block 140, a controller block (also referred to as a "controller") 150, and a corrector 160.

The memory cell array 110 includes a plurality of word lines WL0 to WLx, a plurality of bit lines BL1 to BLm, and a plurality of memory cells, where 'x' and 'm' each denote a natural number. Each of the plurality of memory cells may be connected to one of the plurality of word lines WL0 to WLx and to one of the plurality of bit lines BL1 to BLm.

The plurality of memory cells may store data or data bits. The plurality of memory cells may store data in page units. For example, the page units may be 512 bytes, 1024 bytes, or 2048 bytes. Typically, the page units will be multiples of 512 bytes, but the inventive concept is not limited thereto.

Each of the plurality of memory cells may store one bit or a plurality of bits, and may thus be embodied as a single-level cell (SLC) or a multi-level cell (MLC).

The row decoder 120 may select one of the plurality of word lines WL0 to WLx based on a row address received from an external source (not shown). The column decoder 130 may select at least one of the plurality of bit lines BL1 to BLm based on a column address received from an external source (not shown).

Thus, at least one memory cell may be selected from among the plurality of memory cells in the memory cell array 110 by the row decoder 120 and the column decoder 130.

The column decoder 130 may be connected to or disconnected from the access block 140 via the plurality of bit lines BL1 to BLm in response to an input control signal. The access block 140 includes a plurality of access units (AUs) that are respectively connected to the plurality of bit lines BL1 to BLm.

Data output from the memory cell array 110 is sensed and amplified via the plurality of AUs connected to the plurality of bit lines BL1 to BLm.

The controller block 150 receives an operation command signal CMD1, such as a read command signal, divides the operation command signal CMD1 into at least two paths, based on a predetermined criterion, selects one of the at least two paths, increases a pulse width of the operation command signal CMD1 corresponding to the selected path, and then outputs the signal having the increased pulse width on the selected path. The predetermined criterion may be, for example, whether or not the time interval between logic 'high' pulses of the operation command signal CMD1 is less than or equal to a predetermined interval. The controller block 150 may clear the other path that is not selected. Embodiments according to the inventive concept of the controller block 150 are described in detail below.

Although not shown, the access block 140 may include a sense amplifier and a write driver. When the access block 140 receives an output signal of the controller block 150 and performs an access operation, e.g., a program operation, a write operation, a read operation, or an erase operation, the access block 140 may access the plurality of memory cells.

The corrector 160 may correct errors in data stored in the memory cell array 110.

The memory device 100' of FIG. 1B has the same structure as the memory device 100 of FIG. 1A, except that a memory cell array 110' of the memory device 100' includes a normal cell region 112 and an error correction code (ECC) cell region 114.

The normal cell region 112 includes a plurality of word lines WL0 to WLx, a plurality of bit lines BL1 to BLm, and a plurality of memory cells (data cells). Each of the plurality of data cells may be connected to one of the plurality of word lines WL0 to WLx and to one of the plurality of bit lines BL1 to BLm.

The plurality of data cells may store data or data bits. The plurality of data cells may store data in page units. For example, the page units may be 512 bytes, 1024 bytes, or 2048 bytes. Typically, the page units will be multiples of 512 bytes, but the inventive concept is not limited thereto.

Referring to FIG. 1B, a row decoder 120 may select one of the plurality of word lines WL0 to WLx based on a row address received from an external source (not shown), and a column decoder 130 may select at least one of the plurality of bit lines BL1 to BLm or at least one of the plurality of lines EL1 to ELn based on a column address received from an external source (not shown).

The ECC cell region 114 may include a plurality of memory cells (ECC memory cells). The ECC memory cells may store ECC bits.

Thus, the row decoder 120 and the column decoder 130 may select at least one memory cell from among the plurality of memory cells included in the normal cell region 112, and/or at least one ECC memory cell from among the plurality of ECC memory cells included in the ECC cell region 114.

The column decoder 130 may be connected to or disconnected from the access block 140 via the plurality of bit lines BL1 to BLm included in the normal cell region 112 and the plurality of lines EL1 to ELn included in the ECC cell region 114 in response to an input control signal The access block 140 includes a plurality of access units (AUs) that are respectively connected to the plurality of bit lines BL1 to BLm and/or to the plurality of lines EL1 to ELn.

Data output from the normal cell region 112 is sensed and amplified via the plurality of AUs connected to the plurality of bit lines BL1 to BLm. ECC bits output from the ECC cell region 114 are sensed and amplified via the other AUs connected to the plurality of lines EL1 to ELn.

A controller block 150' receives operation command signals CMD2 and CMD3, e.g., read command signals, divides the operation command signals CMD2 and CMD3 into at least two paths, selects one of the at least two paths based on a predetermined criterion, increases pulse widths of the operation command signals CMD2 and CMD3 corresponding to the selected path, and then outputs the signals having the increased pulse width on the selected path. Embodiments according to the inventive concept of the controller block 150' are described in detail below. The controller block 150' may clear the path that is not selected.

Although not shown, the access block 140 may include a sense amplifier and a write driver. When the access block 140 receives an output signal of the controller block 150' and performs an access operation, e.g., a program operation, a write operation, a read operation, or an erase operation, the access block 140 may access the plurality of memory cells.

A corrector 160 may correct errors in data stored in the normal cell region 112 by using the ECC bits stored in the ECC cell region 114.

Figure 2A:
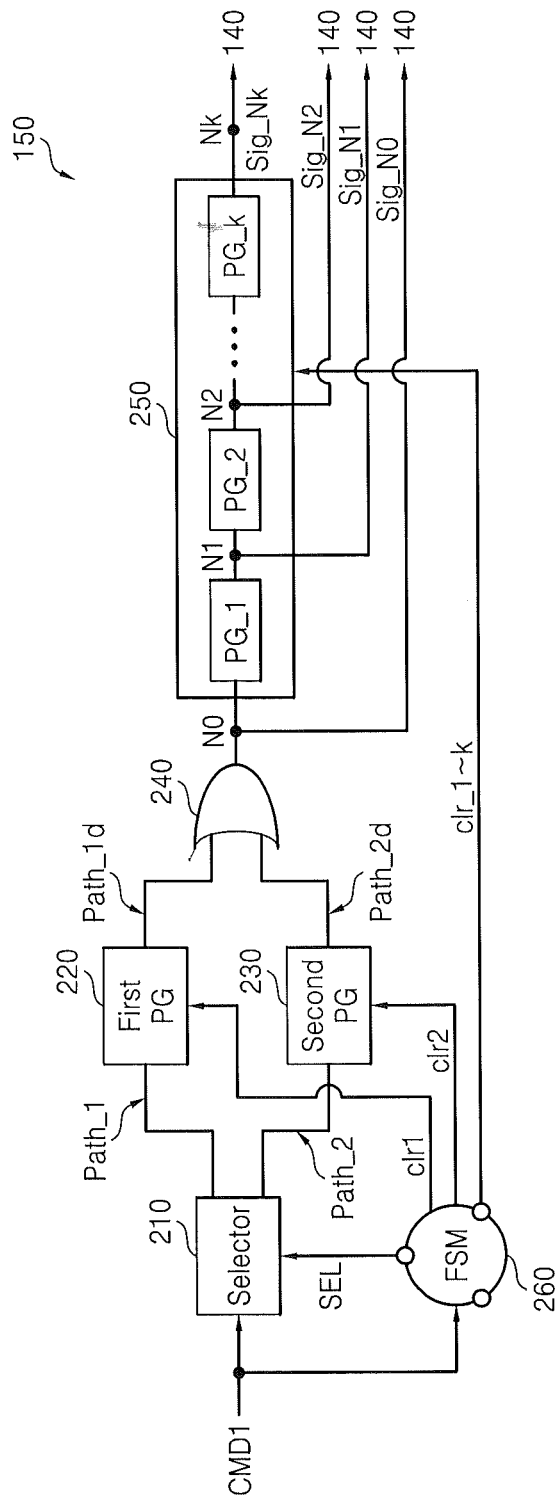
FIG. 2A is a block diagram of the controller block of the memory device illustrated in FIG. 1A according to an embodiment of the inventive concept.
Figure 2B:
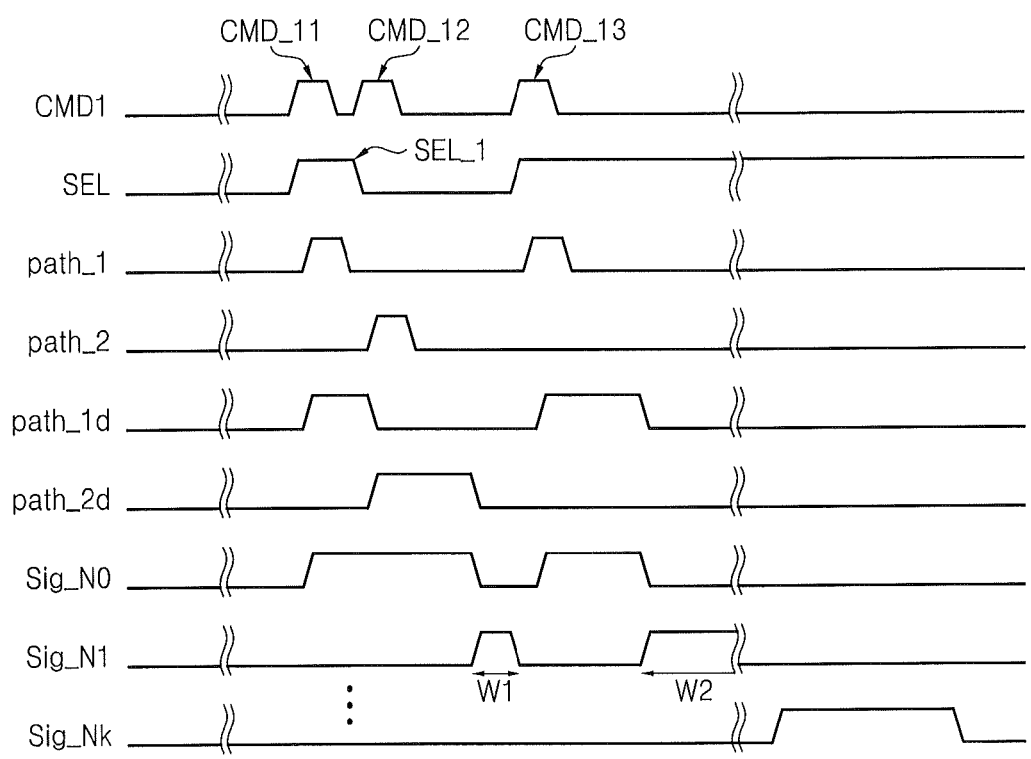
FIG. 2B illustrates waveform diagrams of signals that may be used to operate the controller block of FIG. 2A.

FIG. 2A is a block diagram of the controller block 150 of the memory device 100 illustrated in FIG. 1A according to an embodiment of the inventive concept. FIG. 2B illustrates waveform diagrams of signals that may be used to operate the controller block 150 of FIG. 2A.

Referring to FIG. 2A, the controller block 150 includes a selector 210, a first pulse generator 220, a second pulse generator 230, an OR gate 240, a pulse generator group 250, and a finite state machine (FSM) 260.

The selector 210 receives an operation command signal CMD1, and divides the operation command signal CMD1 into first and second paths based on a selection signal SEL that is received from the FSM 260.

The FSM 260 receives the operation command signal CMD1, supplies the selection signal SEL to the selector 210 based on the operation command signal CMD1, supplies a clear signal clr1 to the first pulse generator 220, supplies a clear signal clr2 to the second pulse generator 230, and supplies a plurality of clear signals clr_1 to clr_k to the pulse generator group 250. The clear signal clr1, the clear signal clr2, and the plurality of clear signals clr_1 to clr_k may be output from the FSM 260 at different time intervals, but aspects of the inventive concept are not limited thereto.

The pulse generator group 250 includes a plurality of pulse generators PG_1 to PG_k that are connected in series. The plurality of pulse generators PG_1 to PG_k may respectively receive the plurality of clear signals Clr_1 to clr_k from the FSM 260.

Each of the first pulse generator 220, the second pulse generator 230, and the plurality of pulse generators PG_1 to PG_k increases a pulse width of a signal input thereto and then outputs the signal having the increased pulse width. More specifically, referring to FIG. 2B, the operation command signal CMD1 is divided into a first path pulse signal path_1 and a second path pulse signal path_2 in response to the selection signal SEL.

For example, as shown in FIG. 2B, the operation command signal CMD1 may include a first logic high command signal CMD_11, a second logic high command signal CMD_12, and a third logic high command signal CMD_13. Moreover, the interval between the first logic high command signal CMD_11 and the second logic high command signal CMD_12 may be less than or equal to a predetermined interval. As shown in FIG. 2B, when the interval between the first logic high command signal CMD_11 and the second logic high command signal CMD_12 is less than or equal to the predetermined interval, the first logic high command signal CMD_11 may be included in the first path pulse signal path_1 and the second logic high command signal CMD_12 may be included in the second path pulse signal path_2.

For example, if the selection signal SEL corresponds to a rising edge of a first logic high signal SEL_1 (see FIG. 2B), the operation command signal CMD1 is transmitted on the first path. If the selection signal SEL corresponds to a falling edge of the first logic high signal SEL_1, the operation command signal CMD1 is transmitted on the second path.

The first pulse generator 220 may receive the first path pulse signal path_1, increase a pulse width of the first path pulse signal path_1, and then output a first path pulse output signal path_1d.

The second pulse generator 230 may receive the second path pulse signal path_2, increase a pulse width of the second path pulse signal path_2, and then output a second path pulse output signal path_2d.

The FSM 260 may output the clear signals ctr1 and clr2 to the first and second pulse generators 220 and 230, respectively. The first and second pulse generators 220 and 230 may determine how much to increase the pulse widths of the signal inputs thereto based on the clear signals clr1 and clr2, respectively.

The OR gate 240 may receive the first path pulse output signal path_1d and the second path pulse output signal path_2d and perform a logic operation thereon, and then may output a result of the logic operation. FIG. 2B illustrates a signal Sig_N0 output from an output terminal of the OR gate 240, i.e., the node N0 in FIG. 2A. As shown in FIG. 2B, the signal Sig_N0 may be equal to the sum of the first path pulse output signal path_1d and the second path pulse output signal path_2d.

The signal Sig_N0 is supplied to the access block 140 and the pulse generator PG_1.

The pulse generator PG_1 receives the signal Sig_N0 from the node N0, generates logic high signals having predetermined pulse widths w1 and w2, and outputs the logic high signals having the predetermined pulse widths w1 and w2 via an output terminal thereof, i.e., the node N1 of FIG. 2A. The pulses having widths w1 and w2 may start from respective falling edges of the pulses of the signal Sig_N0.

The pulse generator PG_1 may also receive the clear signal clr_1 from the FSM 260, and may determine the predetermined pulse widths w1 and w2 based on the clear signal clr_1.

A signal Sig_N1 that is output from the node N1 is supplied to the access block 140 and the pulse generator PG_2. The other pulse generators PG_3 to PG_k operate in a similar manner to pulse generators PG_1 and PG_2, and hence a detailed description thereof is not provided here.

Lastly, a signal Sig_Nk output from a node Nk is supplied to the access block 140.

Figure 3A:
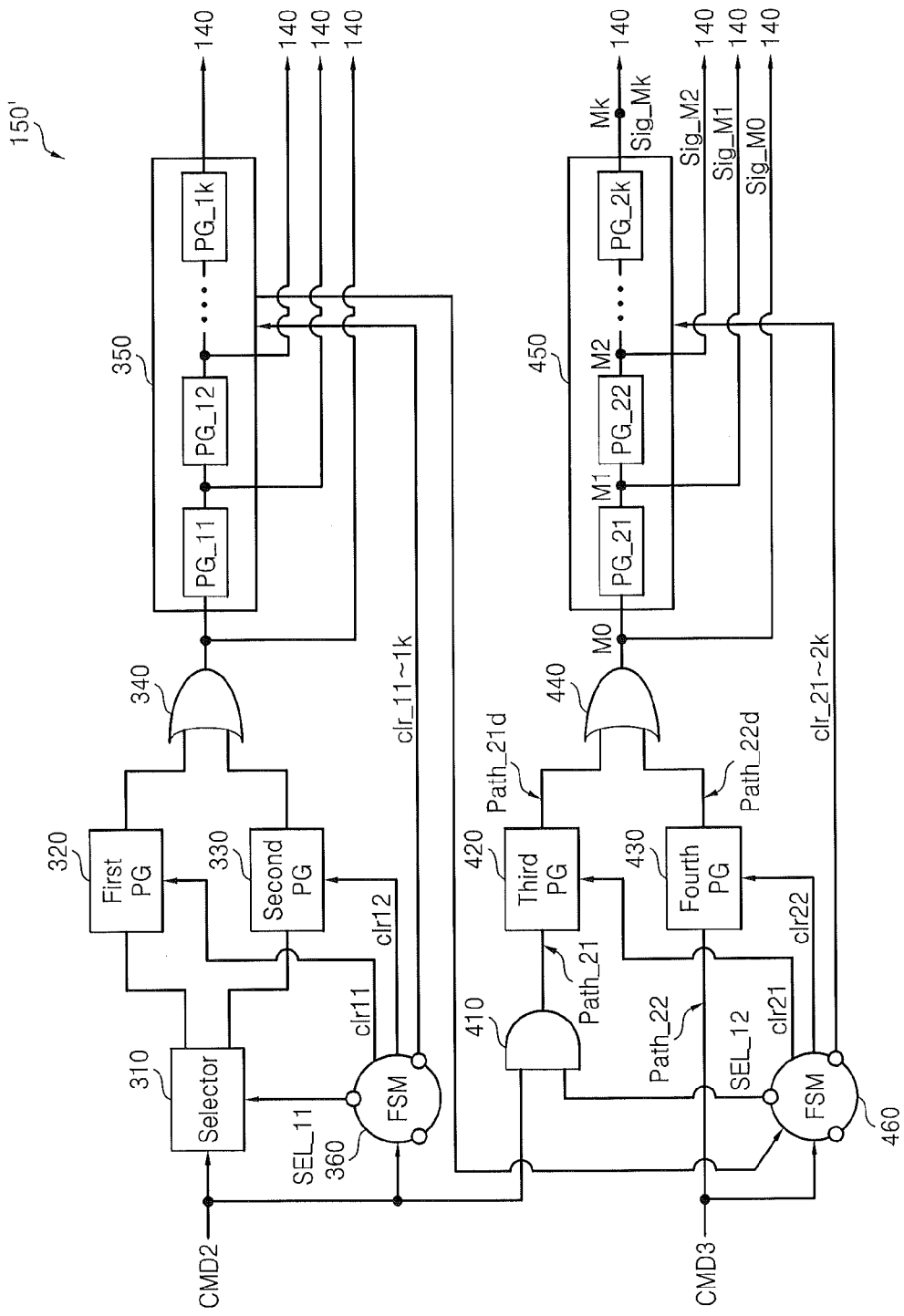
FIG. 3A is a block diagram of the controller block of the memory device illustrated in FIG. 1B according to an embodiment of the inventive concept.
Figure 3B:
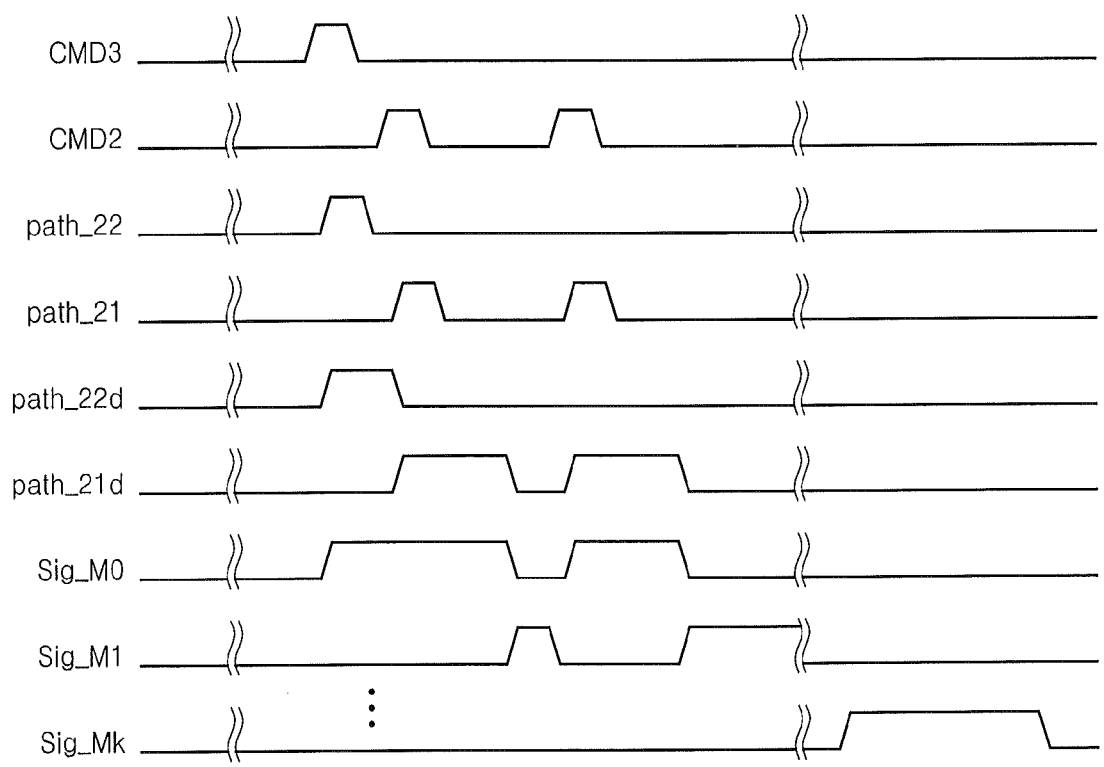
FIG. 3B illustrates waveform diagrams of signals that may be used to operate the controller block of FIG. 3A.

FIG. 3A is a block diagram of the controller block 150' of the memory device 100' of FIG. 1B according to an embodiment of the inventive concept. FIG. 3B illustrates waveform diagrams of signals that may be used to operate the controller block 150' of FIG. 3A.

Referring to FIG. 3A, the controller block 150' includes a selector 310, a first pulse generator 320, a second pulse generator 330, a first OR gate 340, a first pulse generator group 350, a first FSM 360, a NAND gate 410, a third pulse generator 420, a fourth pulse generator 430, a second OR gate 440, a second pulse generator group 450, and a second FSM 460.

The selector 310 receives an operation command signal CMD2, and divides the operation command signal CMD2 into first and second path pulse signals (not shown) corresponding to at least two paths, based on a selection signal SEL_11 that is received from the first FSM 360. The first and second path pulse signals are respectively supplied to the first and second pulse generators 320 and 330.

The first FSM 360 receives the operation command signal CMD2, supplies the selection signal SEL_11 to the selector 310, based on the operation command signal CMD2, supplies a clear signal clr11 to the first pulse generator 320, supplies a clear signal clr12 to the second pulse generator 330, and supplies a plurality of clear signals clr_11 to clr_1k to the first pulse generator group 350. The clear signal clr1, the clear signal clr2, and the plurality of clear signals clr_11 to clr_1k may be output from the first FSM 360 at different time intervals, but aspects of the inventive concept are not limited thereto.

Output signals of the first and second pulse generators 320 and 330 are supplied to the first OR gate 340. The first OR gate 340 performs a logic operation on the output signals, and the signal output from the first OR gate 340 is supplied to the first pulse generator group 350.

The first pulse generator group 350 includes a plurality of pulse generators PG_11 to PG_1k that are connected in series. The plurality of pulse generators PG_11 to PG_1k may respectively receive the plurality of clear signals clr_11 to clr_1k from the first FSM 360.

The second FSM 460 may supply a clear signal clr21 to the third pulse generator 420 and may supply a clear signal clr22 to the fourth pulse generator 430. The second FSM 460 may also supply a plurality of clear signals clr_21 to clr_2k to the second pulse generator group 450.

The second FSM 460 may receive the operation command signal CMD3 and an output signal of the first pulse generator group 350, and outputs either the clear signals clr21 and clr22 or the plurality of clear signals clr_21 to clr_2k, based on the operation command signal CMD3 and the output signal of the first pulse generator group 350. The third and fourth pulse generators 420 and 430 may use the clear signals clr21 and clr22, respectively to determine how much to increase the pulse width of pulses input thereto.

The NAND gate 410 receives the operation command signal CMD2 and a selection signal SEL_12 that is output from the second FSM 460, performs a logic operation thereon, and then outputs a result of the logic operation to the third pulse generator 420.

The fourth pulse generator 430 receives the operation command signal CMD3, increases a pulse width of the operation command signal CMD3, and then outputs the resulting signal. The second OR gate 440 receives the output signals of the third pulse generator 420 and the fourth pulse generator 430, performs a logic operation thereon, and then outputs a result of the logic operation.

The second pulse generator group 450 includes a plurality of pulse generators PG_21 to PG_2k that are connected in series. The plurality of pulse generators PG_21 to PG_2k may respectively receive the plurality of clear signals clr_21 to clr_2k from the second FSM 460.

The second pulse generator group 450 receives and processes an output signal of the second OR gate 440 and the plurality of clear signals clr_21 to clr_2k, and then outputs a signal to the access block 140. More specifically, the plurality of pulse generators PG_21 to PG_2k may receive and process the output signal of the second OR gate 440 and one of the plurality of clear signals clr_21 to clr_2k, and then supply the results of the processing to the access block 140.

Referring to FIG. 3B, the operation command signals CMD2 and CMD3 may be supplied to the third and fourth pulse generators 420 and 430, respectively. As shown in FIG. 3A, the operation command signal CMD2 is supplied to the third pulse generator 420 via the NAND gate 410.

The selection signal SEL_12 is supplied to the NAND gate 410 from the second FSM 460. The value of the selection signal SEL_12 is set based on the operation command signal CMD3 and the output signal of the first pulse generator group 350, and thus allows the operation command signal CMD2 and the operation command signal CMD3 to be transmitted in different paths.

An output signal of the NAND gate 410, i.e., a first path pulse signal path_21, and the operation command signal CMD3, i.e., a second path pulse signal path_22, may be supplied to the third pulse generator 420 and the fourth pulse generator 430, respectively.

Referring to FIG. 3B, a first path pulse output signal path_21d output from the third pulse generator 420 and a second path pulse output signal path_22d output from fourth pulse generator 430 are generated by increasing a pulse width of the first path pulse signal path_21 and a pulse width the second path pulse signal path_22, respectively.

The second OR gate 440 receives the first path pulse output signal path_21d and the second path pulse output signal path_22d, performs a logic operation thereon, and outputs a result of the logic operation. In this case, a signal Sig_M0 illustrated in FIG. 3B is output from an output terminal of the second OR gate 440, i.e., a node M0. The signal Sig_M0 may be equal to the sum of the first path pulse output signal path_21d and the second path pulse output signal path_22d.

The signal Sig_M0 is supplied to the access block 140 and the pulse generator PG_21.

The pulse generator PG_21 receives the signal Sig_M0 from the node M0, generates a logic high signals having a predetermined pulse widths, and output the logic high signals to the output terminal of the second OR gate 440, i.e., a node M1. The output pulses may start from respective falling edges of the pulses of the signal Sig_M0.

The pulse generator PG_21 may also receive the clear signal clr_21 from the second FSM 460, and may determine the predetermined pulse width of the logic high signal based on the clear signal clr_21.

A signal Sig_M1 output from the node M1 is supplied to the access block 140 and the pulse generator PG_22. The other pulse generators PG_23 to PG_2k included in the second pulse generator group 450 may operate in a similar manner and hence a detailed description thereof is not provided here.

Lastly, a signal Sig_Mk output from a node Mk is supplied to the access block 140.

Figure 4A:
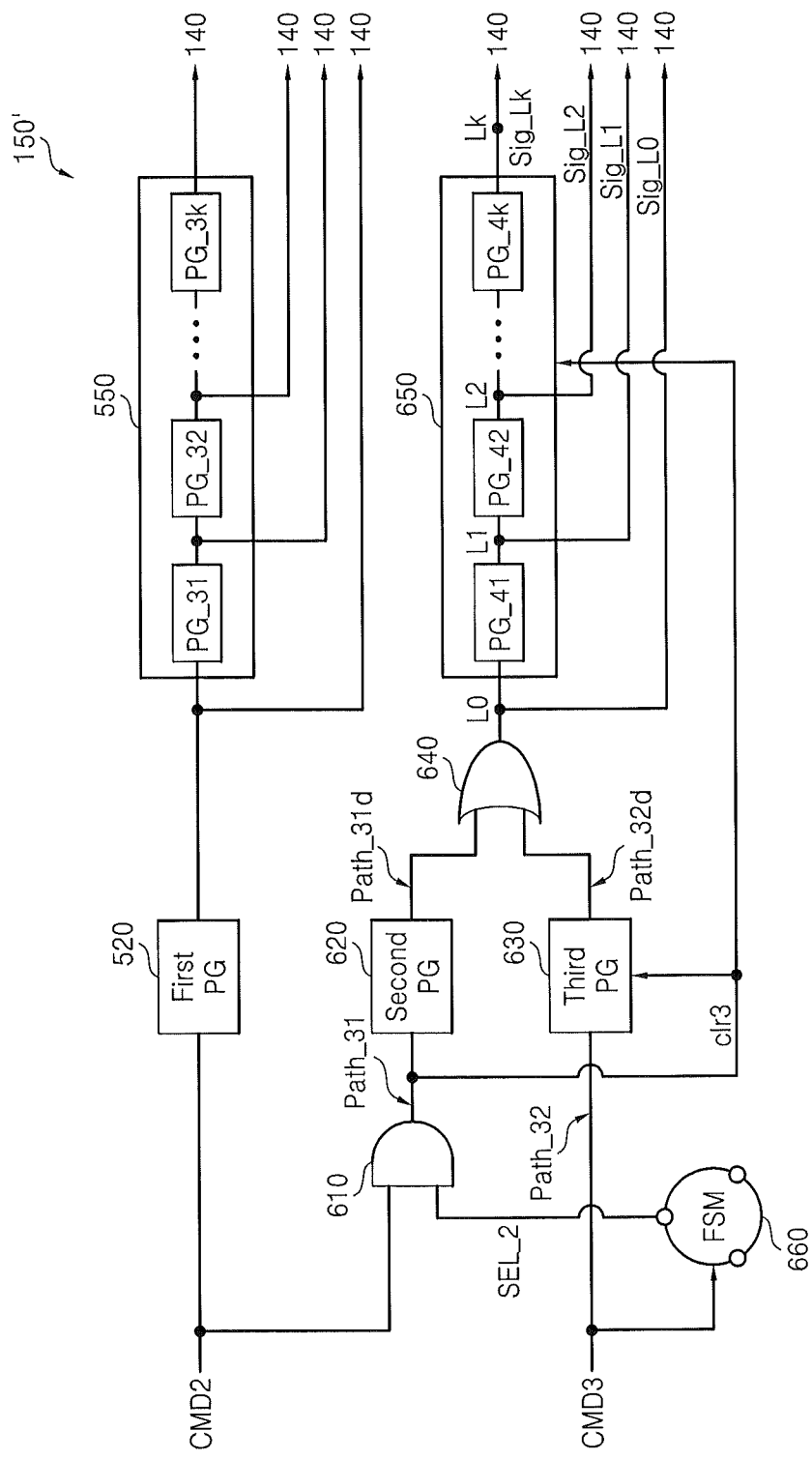
FIG. 4A is a block diagram of the controller block of the memory device illustrated in FIG. 1B according to another embodiment of the inventive concept.
Figure 4B:
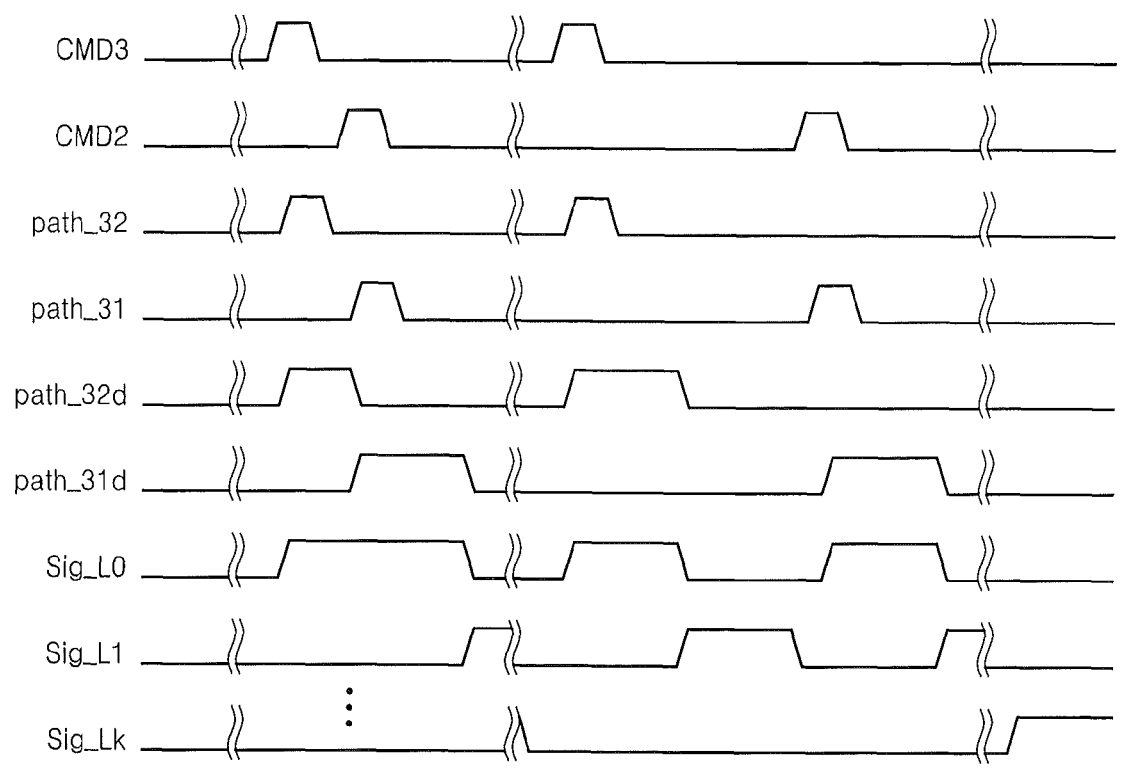
FIG. 4B illustrates waveform diagrams of signals that may be used to operate the controller block of FIG. 4A.

FIG. 4A is a block diagram of the controller block 150' of the memory device 100' of FIG. 1B according to another embodiment of the inventive concept. FIG. 4B is a waveform diagram illustrating signals that may be used to operate the controller block 150' of FIG. 4A.

Referring to FIG. 4A, the controller block 150' includes a first pulse generator 520, a first pulse generator group 550, a NAND gate 610, a second pulse generator 620, a third pulse generator 630, an OR gate 640, a second pulse generator group 650, and an FSM 660.

An operation command signal CMD2 is supplied to the first pulse generator 520, and the first pulse generator 520 increases a pulse width of the operation command signal CMD2 and outputs an increased pulse width operation command signal CMD2 to the first pulse generator group 550.

The first pulse generator group 550 includes a plurality of pulse generators PG_31 to PG_3k that are connected in series. Each of the plurality of pulse generators PG_31 to PG_3k may receive and process signals input thereto and then output a resulting signal to the access block 140. The NAND gate 610 receives the operation command signal CMD2 and a selection signal SEL_2 from the FSM 660 and performs a logic operation thereon, and then outputs a result of the logic operation.

The FSM 660 may receive an operation command signal CMD3 and generate the selection signal SEL_2 based on the operation command signal CMD3.

The second pulse generator 620 receives an output signal of the NAND gate 610, increases a pulse width of the output signal of the. NAND gate 610, and outputs the resulting signal. The third pulse generator 630 receives the operation command signal CMD3, increases a pulse width of the operation command signal CMD3, and outputs the resulting signal. The third pulse generator 630 may determine the pulse width of the operation command signal CMD3 by using the output signal of the NAND gate 610 as a clear signal clr3.

The OR gate 640 receives an output signal of the second pulse generator 620 and an output signal of the third pulse generator 630, performs a logic operation thereon, and then outputs a result of the logic operation.

The second pulse generator group 650 includes a plurality of pulse generators PG_41 to PG_4k that are connected in series. Each of the plurality of pulse generators PG_41 to PG_4k may receive the output signal of the NAND gate 610 as the clear signal clr3.

The second pulse generator group 650 receives and process an output signal of the OR gate 640 and the clear signal clr3 and then outputs a result of the processing to the access block 140. More specifically, each of the plurality of pulse generators PG_41 to PG_4k may receive and process signals input thereto and then output the resulting signal to the access block 140.

Referring to FIG. 4B, the operation command signal CMD2 and the operation command signal CMD3 may be supplied to the second pulse generator 620 and the third pulse generator 630, respectively. As shown in FIG. 4A, the operation command signal CMD2 is supplied to the second pulse generator 620 via the NAND gate 610.

The selection signal SEL_2 is supplied to the NAND gate 610 from the FSM 660. The value of the selection signal SEL_2 is determined based on the operation command signal CMD3. The output signal of the NAND gate 610, i.e., a first pass pulse signal path_31, and the operation command signal CMD3, i.e., a second pass pulse signal path_32, may be supplied to the second pulse generator 620 and the third pulse generator 630, respectively.

Referring to FIG. 4B, a first path pulse output signal path_31d output from the second pulse generator 620 and a second path pulse output signal path_32d output from the third pulse generator 630 are obtained by respectively increasing a pulse width of the first pass pulse signal path_31 and a pulse width of the second pass pulse signal path_32.

The OR gate 640 receives the first path pulse output signal path_31d and the second path pulse output signal path_32d, performs a logic operation thereon, and outputs a result of the logic operation. In this case, a signal Sig_L0 of FIG. 4B is output from an output terminal of the OR gate 640, i.e., a node L0. The signal Sig_L0 may be equal to the sum of the first path pulse output signal path_31d and the second path pulse output signal path_32d. The signal Sig_L0 is supplied to the access block 140 and the pulse generator PG_41.

The pulse generator PG_41 may receive the signal Sig_L0 from the node L0, generates logic high signals having predetermined pulse widths, and then output the logic high signals via an output terminal thereof, i.e., a node L1. The output pulses may start from respective falling edges of the pulses of the signal Sig_L0. The pulse generator PG_41 may receive the output signal of the NAND gate 610, i.e., the clear signal clr3, and determine the predetermined pulse width of the logic high signals based on the clear signal clr3.

A signal Sig_L1 output from the node L1 is supplied to the access block 140 and the pulse generator PG_42. The other pulse generators PG_43 to PG_4k included in the second pulse generator group 650 may operate in a similar manner, and hence, a detailed description thereof is not provided here.

Lastly, a signal Sig_Lk output from a node Lk is supplied to the access block 140.

Figure 5A:
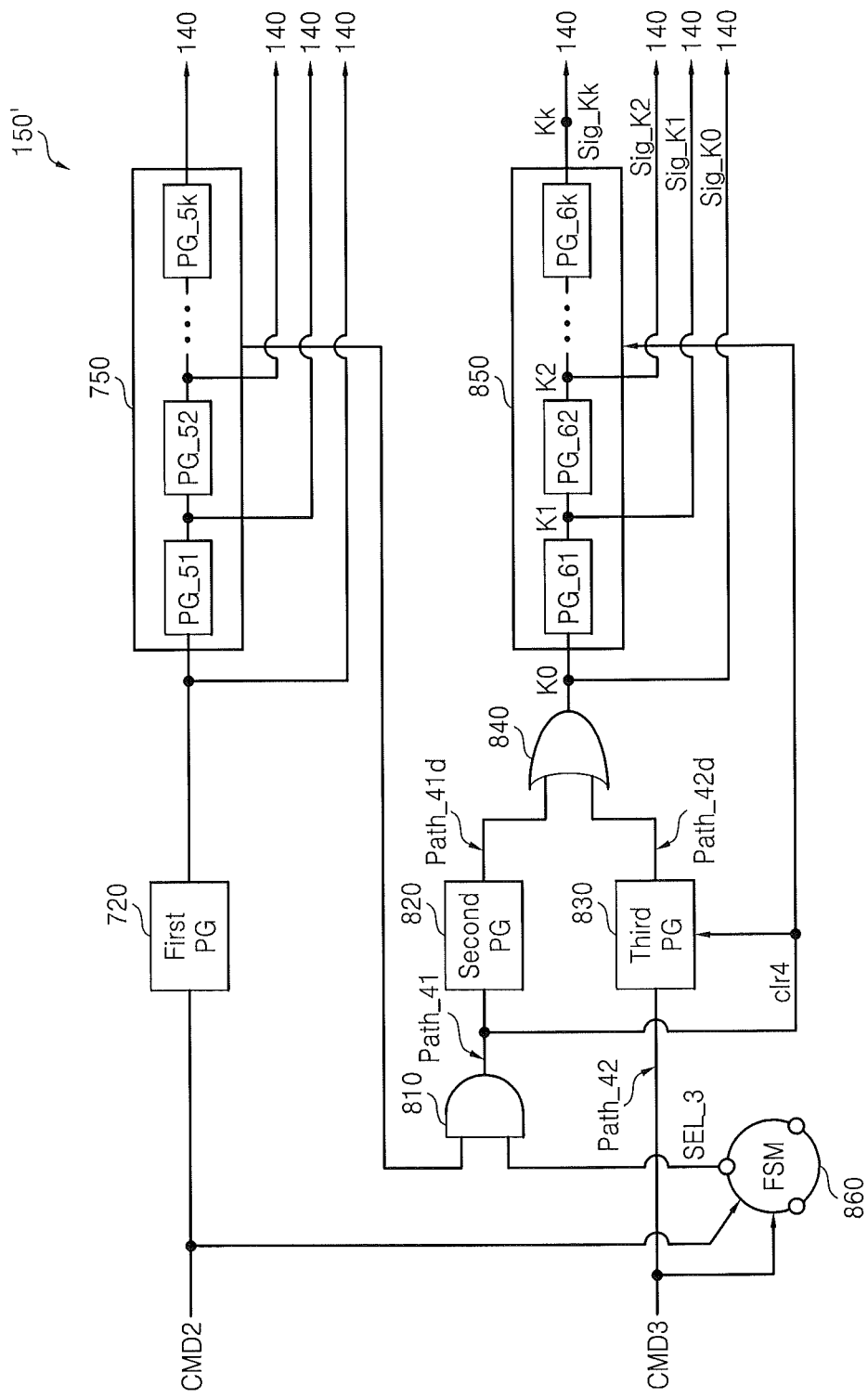
FIG. 5A is a block diagram of the controller block of the memory device illustrated in FIG. 1B according to yet another embodiment of the inventive concept.
Figure 5B:
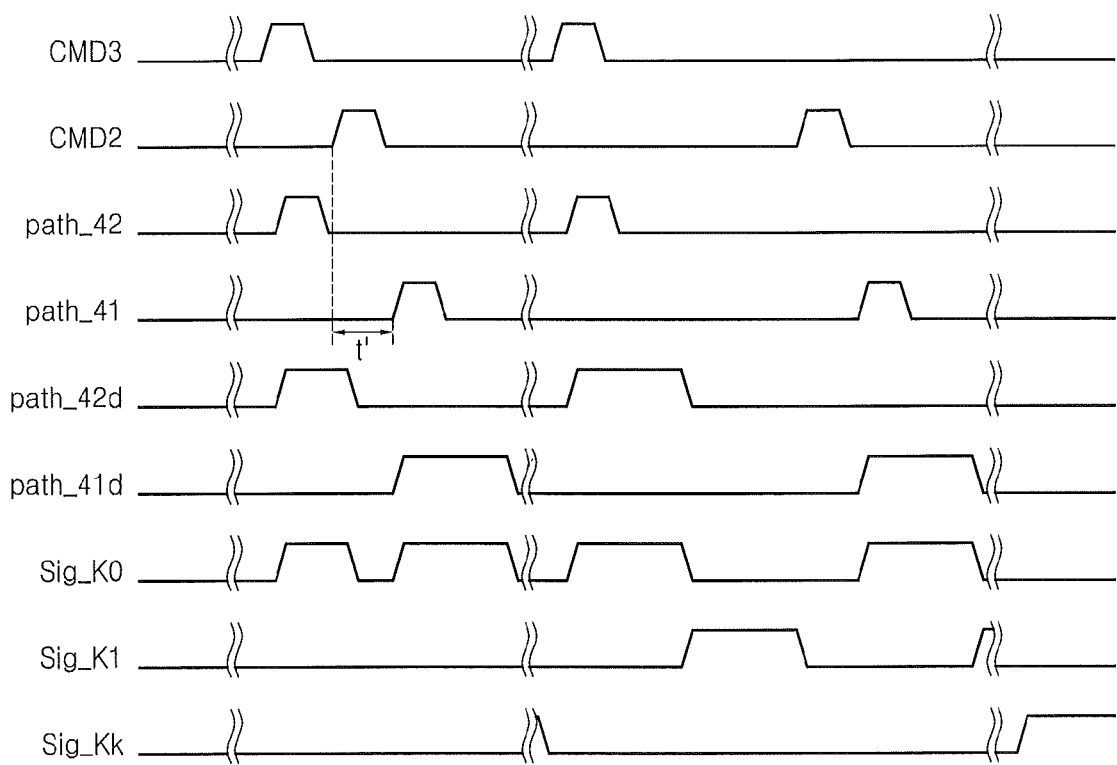
FIG. 5B illustrates waveform diagrams of signals that may be used to operate the controller block of FIG. 4A.

FIG. 5A is a block diagram of the controller block 150' of the memory device 100' of FIG. 1B according to yet another embodiment of the inventive concept. FIG. 5B is a waveform diagram illustrating signals that may be used to operate the controller block 150' of FIG. 5A.

Referring to FIG. 5A, the controller block 150' includes a first pulse generator 720, a first pulse generator group 750, a NAND gate 810, a second pulse generator 820, a third pulse generator 830, an OR gate 840, a second pulse generator group 850, and an FSM 860, An operation command signal CMD2 is supplied to the first pulse generator 720, and the first pulse generator 720 increases a pulse width of the operation command signal CMD2 and outputs the resulting signal to the first pulse generator group 750.

The first pulse generator group 750 includes a plurality of pulse generators PG_51 to PG_5k that are connected in series.

Each of the plurality of pulse generators PG_51 to PG_5k may receive and process signals input thereto and then output the resulting signal to the access block 140. The NAND gate 810 receives an output signal of the first pulse generator group 750 and a selection signal SEL_3 from the FSM 860, performs a logic operation thereon, and then outputs a result of the logic operation.

The FSM 860 may receive the operation command signal CMD2 and an operation command signal CMD3, and may generate the selection signal SEL_3 based on the operation command signal CMD2 and the operation command signal CMD3.

The second pulse generator 820 receives an output signal of the NAND gate 810, increases a pulse width of the output signal of the NAND gate 810, and then outputs the resulting signal. The third pulse generator 830 receives the operation command signal CMD3, increases a pulse width of the operation command signal CMD3, and then outputs the resulting signal. The third pulse generator 830 may determine the pulse width of the operation command signal CMD3 by using the output signal of the NAND gate 810 as a clear signal clr4.

The OR gate 840 receives an output signal of the second pulse generator 820 and an output signal of the third pulse generator 830, performs a logic operation thereon, and then outputs a result of the logic operation.

The second pulse generator group 850 includes a plurality of pulse generators PG_61 to PG_6k that are connected in series. Each of the plurality of pulse generators PG_61 to PG_6k may receive the output signal of the NAND gate 810 as the clear signal clr4.

The second pulse generator group 850 receives and processes an output signal of the OR gate 840 and the clear signal clr4 and then outputs the resulting signals to the access block 140. More specifically, each of the plurality of pulse generators PG_61 to PG_6k may receive and process signals input thereto, and then output a result of the processing to the access block 140.

Referring to FIG. 5B, an output signal of the first pulse generator group 750 and the operation command signal CMD3 are respectively supplied to the second pulse generator group 820 and the third pulse generator 830. The output signal of the first pulse generator group 750 is supplied to the second pulse generator 820 via the NAND gate 810.

The selection signal SEL_3 is supplied to the NAND gate 810 from the FSM 860. The value of the selection signal SEL_3 is determined based on the operation command signal CMD2 and the operation command signal CMD3. Thus, the selection signal SEL_3 may be delayed for a predetermined time and may then be supplied to the NAND gate 810, thereby generating a predetermined time interval t' that is illustrated in FIG. 5B. The predetermined time interval t' may prevent a first path pulse output signal path_41d and a second path pulse output signal path_42d from overlapping with each other.

The output signal of the NAND gate 810, i.e., a first pass pulse signal path_41, and the operation command signal CMD3, i.e., a second pass pulse signal path_42, may be supplied to the second pulse generator 820 and the third pulse generator 830, respectively.

Referring to FIG. 5B, the first path pulse output signal path_41d output from the second pulse generator 820 and the second path pulse output signal path_42d output from the third pulse generator 830 are obtained by respectively increasing a pulse width of the first pass pulse signal path_41 and a pulse width of the second pass pulse signal path_42.

The OR gate 840 receives the first path pulse output signal path_41d and the second path pulse output signal path_42d, performs a logic operation thereon, and then outputs a result of the logic operation. In this case, a signal Sig_K0 of FIG. 5B is output from an output terminal of the OR gate 840, i.e., a node K0. The signal Sig_K0 may be equal to the sum of the first path pulse output signal path_41d and the second path pulse output signal path_42d.

The signal Sig_K0 is supplied to the access block 140 and the pulse generator PG_61.

The pulse generator PG_61 may receive the signal Sig_K0 from the node K0, generate logic high signals having a predetermined pulse width, and then output the logic high signals via an output thereof, i.e., a node K1. The pulses of the output signals may start from falling edges of the signal Sig_K0.

The pulse generator PG_61 may also receive the output signal of the NAND gate 810, i.e., the clear signal clr4, and determine the predetermined pulse width of the logic high signal, based on the clear signal clr4.

A signal Sig_K1 output from the node K1 is supplied to the access block 140 and the pulse generator PG_62.

The other pulse generators PG_63 to PG_6k included in the second pulse generator group 850 may operate in a similar manner, and hence a detailed description thereof is not provided here.

Lastly, a signal Sig_Kk output from a node Kk is supplied to the access block 140.

Figure 6:
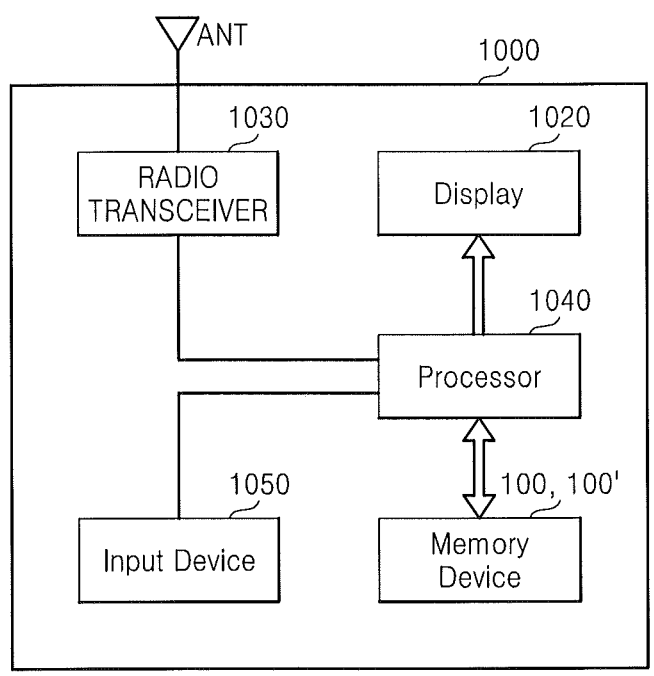
FIG. 6 is a block diagram of a memory system according to an example embodiment of the inventive concept.

FIG. 6 is a block diagram of a memory system 1000 according to an example embodiment of the inventive concept. The memory system 1000 may be embodied in, for example, a cellular phone, a smart phone, or a wireless internet device.

The memory system 1000 includes the memory device 100 or 100'. A processor 1040 may control the operation of the memory device 100 or 100'. The memory device 100 or 100' may be the memory device shown FIG. 1A or FIG. 1B.

Data programmed in the memory device 100 or 100' may be displayed through a display 1020 under the control of the processor 1040.

A radio transceiver 1030 may transmit or receive a radio signal through an antenna ANT. For example, the radio transceiver 1030 may convert a radio signal received through an antenna ANT into a signal which may be processed by the processor 1040. Accordingly, the processor 1040 may process a signal output from the radio transceiver 1030 and store a processed signal in the memory device 100 or 100', or display the processed signal through the display 1020.

The radio transceiver 1030 may also convert a signal output from the processor 1040 into a radio signal and output this radio signal to an external device through the antenna ANT.

An input device 1050 is a device which may input a control signal for controlling an operation of the processor 1040 or data to be processed by the processor 1040. It may be embodied, for example, in a pointing device such as a touch pad and a computer mouse, a keypad or a keyboard.

The processor 1040 may control an operation of the display 1020 so that data output from the memory device 100 or 100', data output from the radio transceiver 1030 or data output from the input device 1050 may be displayed through the display 1020. According to an example embodiment, a memory controller that controls operation of the memory device 100 or 100' may be embodied as a part of the processor 1040 or as a chip separate from the processor 1040 (not shown). In this case, the memory controller may control an operation of the memory device 100 or 100' according to a control of the processor 1040.

Figure 7:
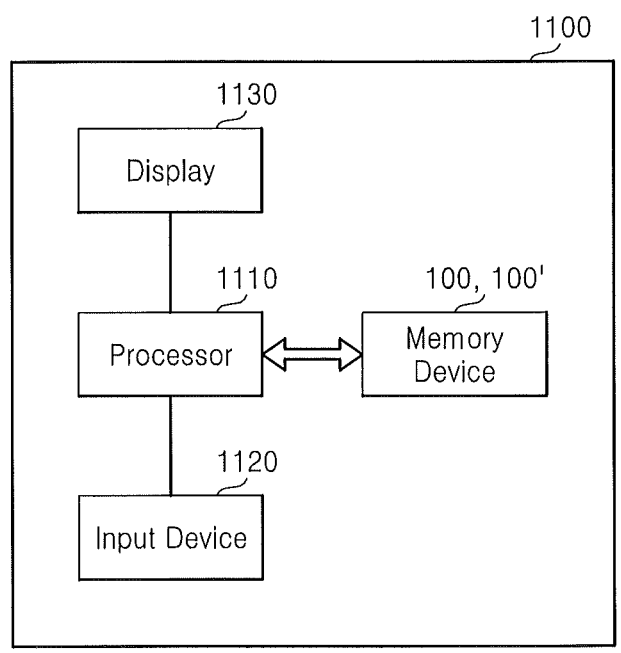
FIG. 7 is a block diagram of a memory system according to another example embodiment of the inventive concept.

FIG. 7 is a block diagram of a memory system 1100 according to another example embodiment of the present invention. The memory system 1100 may be embodied, for example, in a personal computer (PC), a tablet PC, a netbook, an e-reader, a personal digital assistant (PDA), a portable multimedia player (PMP), a MP3 player or a MP4 player.

The memory system 1100 includes the memory device 100 or 100' and the processor 1110 controlling a data processing operation of the memory device 100 or 100'. The memory device 100 or 100' may be the memory device shown FIG. 1A or FIG. 1B.

A processor 1110 may display data stored in the memory device 100 or 100' through a display 1130 according to data input through an input device 1120. For example, the input device 1120 may be embodied, for example, in a pointing device such as a touch pad or a computer mouse, a keypad or a keyboard.

According to an example embodiment, the memory controller (not shown) controlling an operation of the memory device 100 or 100' may be embodied as a part of the processor 1110 or as a chip separate from the processor 1110. In this case, the memory controller may control an operation of the memory device 100 or 100' according to a control of the processor 1110.

Figure 8:
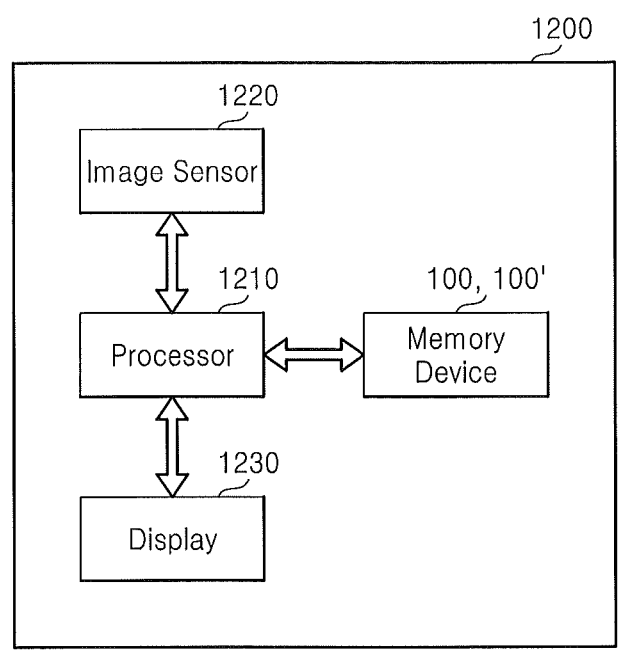
FIG. 8 is a block diagram of a memory system according to still another example embodiment of the inventive concept.

FIG. 8 is a block diagram of a memory system 1200 according to still another example embodiment of the present invention. The memory system 1200 may be embodied, for example, in a digital camera or a digital camera-equipped cellular phone. The memory system 1200 includes the memory device 100 or 100' and a processor 1210 that may control a data processing operation of the memory device 100 or 100'. The memory device 100 or 100' may be the memory device shown FIG. 1A or FIG. 1B.

An image sensor 1220 of the memory system 1200 converts an optical image into digital signals. The converted digital signals may be stored in the memory device 100 or 100' or displayed through a display 1230 under the control of the processor 1210.

In addition, data stored in the memory device 100 or 100' is displayed through the display 1230 under the control of the processor 1210. According to an example embodiment, the memory controller (not shown) controlling an operation of the memory device 100 or 100' may be embodied as a part of the processor 1210 or as a chip separate from the processor 1210. In this case, the memory controller may control an operation of the memory device 100 or 100' according to a control of the processor 1210.

Figure 9:
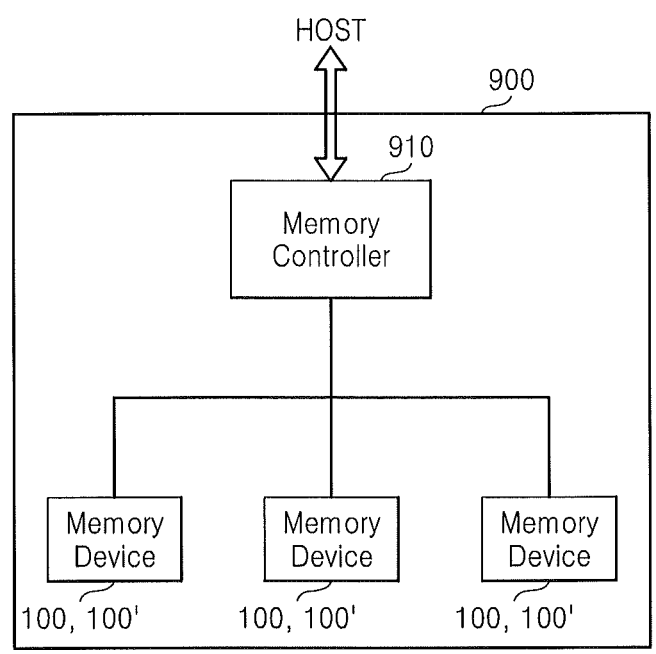
FIG. 9 is a block diagram of a memory system, which includes the memory device shown in FIGS. 1A and 1B, according to still another example embodiment of the inventive concept.

FIG. 9 is a block diagram of a memory system 900, which includes the memory device shown FIG. 1A or 1B, according to still another example embodiment of the inventive concept. The memory system 900 may be embodied in a data processing device such as a solid state drive (SSD). The memory system 900 may include a plurality of memory devices 100 or 100' and a memory controller 910 that controls a data processing operation of each of the plurality of memory devices 110 or 100'.

As described above, a semiconductor device according to an embodiment of the inventive concept may stably operate even if read commands are input thereto at intervals that are shorter than predetermined intervals.

Furthermore, even though two or more read commands are input to semiconductor devices according to embodiments of the inventive concept, it is possible to minimize or prevent the two or more read operations from overlapping with each other.

While the inventive concept has been particularly shown and described with reference to exemplary embodiments thereof, it will be understood that various changes in form and details may be made therein without departing from the spirit and scope of the following claims.

What is claimed is:

1. A memory device comprising:
    a memory cell array including a plurality of bit lines and a plurality of memory cells;
    an access block that is configured to access the memory cell array; and
    a controller that is configured to receive a first operation command signal, and divide the first operation command signal into at least a first path pulse signal that is transmitted on a first path and a second path pulse signal that is transmitted on a second path based on a predetermined criterion,
    wherein the access block operates based on an output signal of the controller,
    wherein the first and second path pulse signals are output to the access block.

2. The memory device of claim 1, wherein the controller comprises:
    a selector that is configured to divide the first operation command signal into the first path pulse signal and the second path pulse signal based on a first selection signal input thereto;
    a first pulse generator that is disposed along the first path, the first pulse generator being configured to increase a pulse width of the first path pulse signal;
    a second pulse generator that is disposed along the second path, the second pulse generator being configured to increase a pulse width of the second path pulse signal;
    a first logic gate that is configured to receive output signals of the first and second pulse generators; and
    a first pulse generator group that is connected to an output of the first logic gate, the first pulse generator group including a plurality of third pulse generators that are connected in series,
    wherein the access block receives the output of the first logic gate, and wherein each of the plurality of third pulse generators increases a pulse width of a signal input to each of the plurality of the third pulse generators, starting from a predetermined point of time, and then outputs a respective signal having the increased pulse width to the access block.

3. The memory device of claim 2, wherein the controller further comprises a first finite state machine that is configured to supply the first selection signal to the selector and to supply a plurality of first clear signals to the first pulse generator, the second pulse generator and the plurality of third pulse generators, respectively.

4. The memory device of claim 2, wherein the plurality of memory cells included in the memory cell array comprise:
    a plurality of data cells for storing data or data bits; and
    error correcting code (ECC) cells for storing ECC bits.

5. The memory device of claim 4, wherein the controller further comprises:
    a second finite state machine that is configured to output a second selection signal in response to an output signal of the first pulse generator group and a second operation command signal;
    a second logic gate that is configured to receive the first operation command signal and the second selection signal;
    a fourth pulse generator that is configured to receive an output of the second logic gate and increase a pulse width of the output signal of the second logic gate;
    a fifth pulse generator that is configured to receive the second operation command signal;

a third logic gate that is configured to receive output signals of the fourth pulse generator and the fifth pulse generator, perform a logic operation thereon, and then output a result of the logic operation; and a second pulse generator group connected to the third logic gate, the second pulse generator group including a plurality of sixth pulse generators that are connected in series, wherein the access block receives the output of the third logic gate, and wherein each of the plurality of sixth pulse generators increases a pulse width of a signal input to each of the plurality of sixth pulse generators, starting from a predetermined point of time, and then outputs a respective signal having the increased pulse width to the access block.

6. The memory device of claim 5, wherein the second finite state machine outputs a plurality of second clear signals, and the fourth pulse generator increases a pulse width of the signal input thereto based on one of the plurality of second clear signals the fifth pulse generator increases a pulse width of the signal input thereto based on one of the plurality of second clear signals, and the plurality of sixth pulse generators each increase a pulse width of the signal input thereto based on one of the plurality of second clear signals.

7. A memory device comprising:
a memory cell array that includes a data cell region that is configured to store data or data bits and an error correcting code (ECC) cell region that is configured to store ECC bits;
an access block that is configured to access the memory cell array; and
a controller that is configured to receive at least first and second operation command signals, and divide each of the first and second operation command signals into first and second path pulse signals that correspond to first and second paths based on a predetermined criterion,
wherein the access block operates in response to an output signal of the controller,
wherein the first and second path pulse signals are output to the access block.

8. The memory device of claim 7, wherein the controller comprises:
a first finite state machine that is configured to receive the second operation command signal and to output a first selection signal based on the second operation command signal;
a first logic gate that is configured to receive the first operation command signal and the first selection signal, perform a logic operation thereon, and then output a result of the logic operation;
a first pulse generator that is configured to receive an output signal of the first logic gate and increase a pulse width of the output signal of the first logic gate;
a second pulse generator that is configured to receive the second operation command signal;
a second logic gate that is configured to receive output signals of the first pulse generator and the second pulse generator, perform a logic operation thereon, and then output a result of the logic operation; and
a first pulse generator group that is connected to the first logic gate, the first pulse generator group including a plurality of third pulse generators that are connected in series,
wherein the access block receives the output of the second logic gate, and wherein each of the plurality of third pulse generators increases a pulse width of a signal input to each of the plurality of third pulse generators, starting from a predetermined point of time, and then outputs a respective signal having the increased pulse width to the access block.

9. The memory device of claim 7, wherein the controller comprises:
a first finite state machine that is configured to receive the first operation command signal and the second operation command signal and to output a first selection signal based on the first operation command signal and the second operation command signal;
a first pulse generator that is configured to increase a pulse width of the first operation command signal;
a first pulse generator group that is configured to receive an output signal of the first pulse generator, increase a pulse width of the output signal of the first pulse generator starting from a predetermined point of time, and then output a signal having the increased pulse width;
a first logic gate that is configured to receive the first selection signal and an output signal of the first pulse generator group, perform a logic operation thereon, and then output a result of the logic operation;
a second pulse generator that is configured to receive an output signal of the first logic gate, increase a pulse width of the output signal of the first logic gate starting from a predetermined point of time, and then output a signal having the increased pulse width;
a third pulse generator that is configured to receive the second operation command signal;
a second logic gate that is configured to receive output signals of the second pulse generator and the third pulse generator, perform a logic operation thereon, and then output a result of the logic operation; and
a second pulse generator group connected to the second logic gate, the second pulse generator group including a plurality of fourth pulse generators that are connected in series,
wherein an output of the second logic gate is connected to the access block, and
each of the plurality of fourth pulse generators increases a pulse width of a signal input to each of the plurality of fourth pulse generators, starting from a predetermined point of time, and outputs a respective signal having the increased pulse width to the access block.

10. The memory device of claim 9, wherein the first logic gate is an AND gate and the second logic gate is an OR gate.

11. The memory device of claim 8, wherein each of the second pulse generator and the plurality of third pulse generators increases a pulse width of a signal input thereto based on an output signal of the first logic gate.

12. The memory device of claim 11, wherein the first logic gate is an AND gate and the second logic gate is an OR gate.

13. A memory device, comprising:
a memory cell array that includes a plurality of bit lines and a plurality of memory cells;
an access block that is configured to access the memory cells via the plurality of bit lines;
a controller that is configured to selectively route a plurality of pulses that are included in one or more operation command signals to one of a first path or a second path in response to a selection signal; and
a combiner that is configured to combine a first signal that is output from the first path and a second signal that is output from the second path and to supply the combined signal to the access block;

a first group of pulse generators that are connected in series, wherein a third pulse generator that is on an end of the first group of pulse generators receives the combined signal, and wherein a value of the selection signal is based on whether an interval between a first logic high signal of the one or more operation command signals and a second logic high signal of the one or more operation command signals is less than or equal to a predetermined interval.

14. The memory device of claim 12, wherein the combiner comprises a logic gate that receives the first and second signals.

15. The memory device of claim 12, wherein each pulse generator in the first group of pulse generators is configured to increase a pulse width of a respective pulse signal that is input thereto.

16. The memory device of claim 12, wherein the one or more operation command signals comprises a first operation command signal and a second operation command signal, the memory device further comprising a logic gate that receives the first operation command signal and a selection signal, wherein the output of the logic gate is connected to the first path.

17. A method of providing first and second read commands to an access block of a memory device, the method comprising:

transmitting the first read command on a first path;
transmitting the second read command on a second path;
increasing a pulse width of the first read command to provide a modified first read command; and
providing the modified first read command to the access block.

18. The method of claim 17, further comprising:
increasing a pulse width of the second read command to provide a modified second read command; and
providing the modified second read command to the access block.

19. The method of claim 18, further comprising generating a combined signal that includes the modified first read command and the modified second read command, wherein providing the modified first read command to the access block and providing the modified second read command to the access block comprises providing the combined signal to the access block.

20. The method of claim 17, further comprising setting a pulse width of the modified first read command based on an operation command signal that includes the first and second read commands.

21. The memory device of claim 1, further comprising a first logic circuit that is configured to receive output signals from the first path and the second path.

22. The memory device of claim 7, further comprising a first logic circuit that is configured to receive output signals from the first path and the second path.

23. The memory device of claim 1, wherein the predetermined criterion comprises an interval between a first logic high signal of the first operation command signal and a second logic high signal of the first operation command signal being less than or equal to a predetermined interval.

* * * * *